United States Patent [19]
Engle

[11] Patent Number: 5,838,119
[45] Date of Patent: *Nov. 17, 1998

[54] ELECTRONIC CHARGE STORE MECHANISM

[76] Inventor: Craig D. Engle, 336 Cline Ave., Griffith, Ind. 46319

[ * ] Notice: The term of this patent shall not extend beyond the expiration date of Pat. No. 5,838,119.

[21] Appl. No.: 664,417

[22] Filed: Jun. 17, 1996

Related U.S. Application Data

[63] Continuation-in-part of Ser. No. 183,037, Jan. 18, 1994, Pat. No. 5,557,177.

[51] Int. Cl.⁶ .............................. G09G 1/04; G09G 3/22; H01J 29/56; H04N 5/70
[52] U.S. Cl. ...................... 315/366; 315/13.11; 313/422; 348/800; 345/74
[58] Field of Search .......................... 315/366, 11, 13.11; 313/422, 103 R, 103 CM; 348/753, 800, 809, 777; 349/31; 345/74

[56] References Cited

U.S. PATENT DOCUMENTS

| | | | |
|---|---|---|---|
| 3,660,668 | 5/1972 | Wolski | 313/103 CM |
| 3,885,180 | 5/1975 | Carts, Jr. | 313/103 CM |
| 4,020,376 | 4/1977 | Bosserman et al. | 313/103 CM |
| 4,525,653 | 6/1985 | Smith | 315/366 |
| 4,577,133 | 3/1986 | Wilson | 313/103 CM |
| 4,958,104 | 9/1990 | Suzuki et al. | 313/495 |
| 5,300,862 | 4/1994 | Parker et al. | 315/169.1 |

Primary Examiner—Gregory C. Issing

[57] ABSTRACT

A charge storage target (66) comprising an electron collector mesh (112) and a plurality of column conductors (86) affixed to a substrate (74) is bombarded with electrons from a row addressed array (12). The array (12) comprises a monolithic electrode (20) overlapped by a plurality of row electrodes (32). Associated with each row electrode (32) is a plurality of sources (44) comprising an electron emissive means (50) for emitting a plurality of electrons dependent upon a potential difference applied between the row electrode (32) and the monolithic electrode (20) by a sequencer (58). Electrons are accelerated toward and focused on target (66) in a high velocity equilibrium mode of writing. A potential control means (192) is provided to apply a potential to each column conductor (86). A clock circuit (64) is provided to synchronize the sequencer (58) with the potential control means (192) enabling an electronic charge quantity to be deposited on a ring 70 of a respective pixel 109 in the row p of pixels 109 overlapping sources (44) in the row p of sources (44) emitting electrons which is dependent upon the potential applied to the column conductor (86) relative to ground potential (56) applied to mesh (112). Advantages include a flood beam mode of operation and compensation for non uniform electron emissions from the emitting means (50) of the sources (44) of array (12).

19 Claims, 4 Drawing Sheets

FIG. 6

ELECTRONIC CHARGE STORE MECHANISM

RELATED APPLICATION

This application is a continuation in part of earlier application U.S. Ser. No. 08/183,037, filed Jan. 18, 1994, U.S. Pat. No. 5,557,177 of Craig D. Engle for "Enhanced Electron Beam Addressed Storage Target".

BACKGROUND: FIELD OF THE INVENTION

This invention relates to row addressed electron beam source arrays interfaced with charge storage targets comprising a plurality of column conductors.

BACKGROUND: PRIOR ART

U.S. Pat. No. 5,036,317 to Buzak, Jul. 30, 1991, utilizes row at a time electron beam addressing to scan a charge storage target comprising a plurality of column conductors. U.S. Pat. No. 5,036,317, suffers from a multitude of limitations. U.S. Pat. No. 5,036,317 utilizes a single liner source array which generates electrons with trajectories essentially parallel to the target surface to be bombarded. As to be identified herein, my invention can utilize row at a time addressing for write operations and an electron beam flood mode for read operations. Due to the geometry associated with the electron beam scanning mechanism of U.S. Pat. No. 5,036,317, such a hybrid mode of operation is not feasible with U.S. Pat. No. 5,036,317.

As to be shown herein, my invention utilizes an electron beam source array positioned relative to a storage target to enable electrons which are emitted from the sources of the array to the travel in a direction which is predominantly perpendicular to the storage target. This enables my invention to avoid the limitations present in U.S. Pat. No. 5,036,317.

U.S. Pat. No. 2,728,815 identifies a serially scanned electron beam addressed device which utilizes a storage target comprising a plurality of column conductors. Use of a serially scanned element at a time adressing mechanism generates secondary electrons associated with the scanning of the second stripe regions due to the raster scan pattern. Dwell time is defined as the duration an electron beam bombards a particular pixel element of the target. Dwell time is dependent upon the number of pixel elements in a row and the number of rows in a frame and the frame time. Use of a serially scanned raster pattern reduces the electron beam dwell time at each pixel element when compared to utilizing row at a time electron beam addressing.

As to be shown herein, use of my invention provides considerable latitude in adjusting the dwell time over prior art configurations. Such considerations enables compensation for non uniform emissions from electron beam source arrays. Increasing the latitude associated with establishing dwell times facilitates the utilization of sub frame addressing.

Additional storage target devices which utilize a serially scanning means include the device described in the article titled "The Selective Electrostatic Storage Tube", by Jan Rajchman, RCA review, March 1951. Additional information concerning this and related devices may be found in the book titled "Storage Tubes" and "Their Basis Principle" by M. Knoll and B. Kazan, John Wiley & Sons, Inc. copyright 1952, pages 92 to 96. As indicated in the references, the Selective Electrostatic Storage Tube is capable of generating a luminous output dependent upon the charge stored on a transmission grid. Limitations of the device include the use of a serial scanning technique associated with the electron beam writing operations. As identified above, serial electron beam scanning techniques have limitations which adversely effect performance attainable.

OBJECT AND ADVANTAGES

Accordingly, several objects and advantages of my invention include:

1) To introduce the concept of a row addressed field emitter array and identify how to interface a row addressed field emitter array to imaging and display charge storage targets.
2) To identify the advantages of utilizing a row addressed field emitter array.
3) To identify alternative electron emitting means for use in row addressed electron beam source arrays.
4) To identify how to configure a row addressed electron beam source arrays with a charge storage target configured to function as a transmission modulation device.
5) To identify light emissive materials which are compatible with the charge storage target of my invention.
6) To identify light sensitive materials which are compatible with the electronic charge storage target of my invention.
7) To identify alternative scan means which are compatible with a row addressed linear electron beam source array and to identify the advantages of such a configuration.

Further objects and advantages of my invention will become apparent from a consideration of the drawings and ensuing description of it.

DESCRIPTION OF THE FIGURES

In the drawings, closely related figures have the same number but different alphabetic suffixes.

DESCRIPTION OF INVENTION

Figure 1:
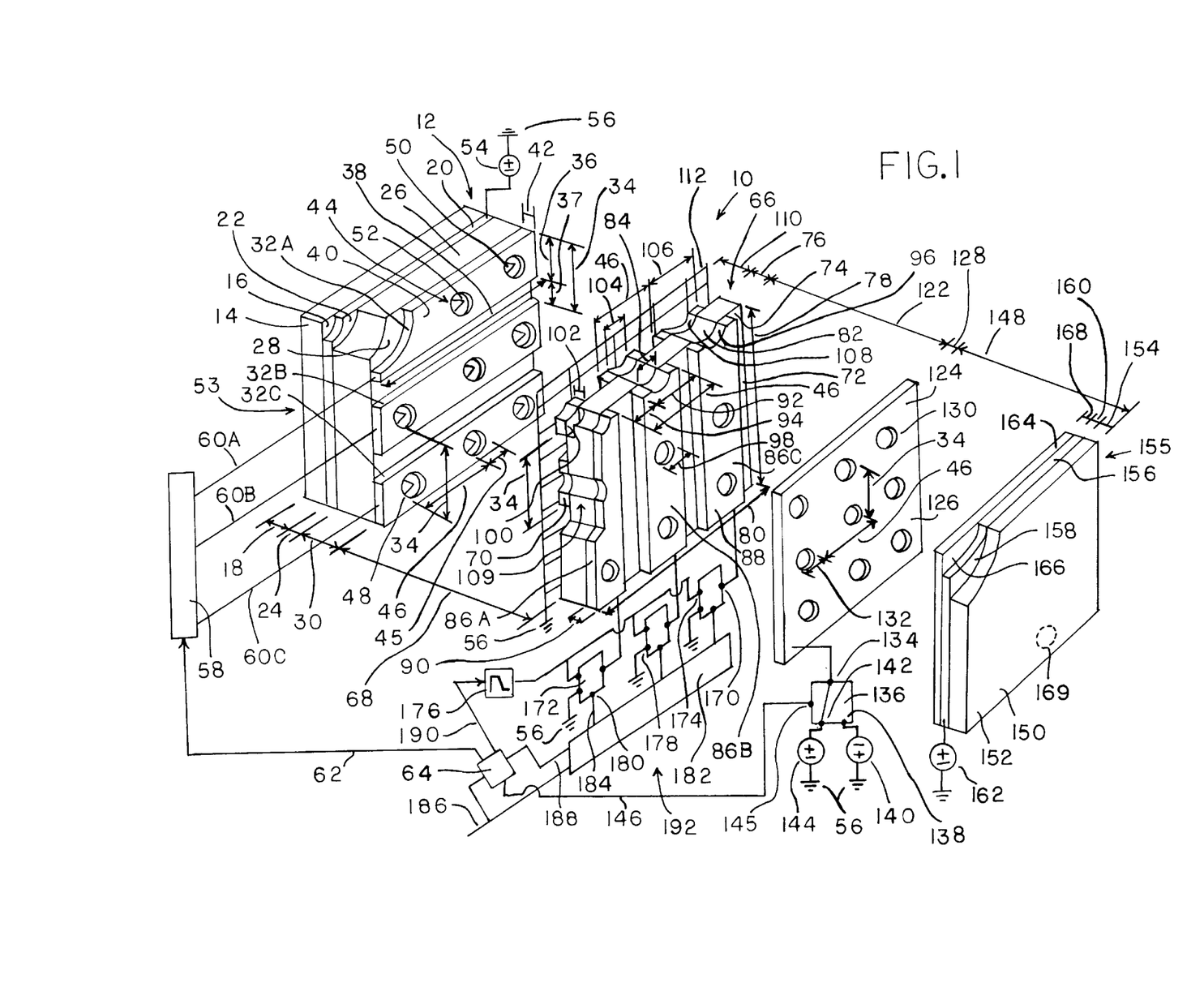
FIG. 1 shows a row addressed field emitter array interfaced to a storage target configured to function as a transmission grid modulator in series with a light emissive target comprising a light emissive means.

FIG. 1 shows a row addressed charge storage display 10. Display 10 further includes a row addressed field emitter array 12. Array 12 further includes an insulating rigid support plate 14. Plate 14 further includes a first surface 16 essentially parallel to and separated from a second plate surface by a plate thickness 18. Thickness 18 is perpendicular to surface 16. The second major surface of plate 14 is not visible in the figure. Materials utilizable for plate 14 include glass.

Affixed to first surface 16 is a monolithic electrode 20. Electrode 20 further includes a first surface 22 essentially parallel to and separated from a second electrode surface by an electrode thickness 24. The second electrode surface of electrode 20 is not visible in the figure. Thickness 24 is perpendicular to surface 22 and parallel to thickness 18. Materials utilizable for electrode 20 include ITO. Techniques for affixing a monolithic electrode to an insulating plate include vacuum deposition. Such techniques include evaporation and sputtering. Alternatively, plate 14 and electrode 20 affixed to plate 14 can be replaced by a high conductivity silicon substrate.

Affixed to electrode 20 is an insulating layer 26. Layer 26 further includes a first surface 28 essentially parallel to and separated from a second layer surface by an insulating thickness 30. Thickness 30 is perpendicular to surface 28 and parallel to thickness 18. Materials utilizable for use as an insulating layer in the row addressed field emitter array of my invention include silicon dioxide.

Affixed to surface 28 is a plurality of row electrodes 32. Three electrodes 32A thru 32C are shown in FIG. 1. Row electrodes 32 in the FIG. 1 are given a different suffix to assist in identifying different row electrodes 32. Adjacent row electrodes 32 are displayed by a first period 34. Period 34 is perpendicular to thickness 30. Each row electrode 32 further includes a row electrode width 36. Width 36 is parallel to period 34. Adjacent row electrodes 32 are separated by a row gap 37. Gap 37 is parallel to period 34. Each row electrode 32 further includes a row electrode length 38. Length 38 is perpendicular to width 36 and perpendicular to thickness 30. Materials utilizable for row electrodes include molybdenum. Additional materials utilizable for row electrodes includes niobium.

Each row electrode 32 further includes a first row electrode surface 40 essentially parallel to and separated from a second row electrode surface by an electrode thickness 42. Electrode thickness 42 is perpendicular to surface 40 and parallel to thickness 30.

Array 12 further includes a plurality of electron beam sources 44 arranged into a matrix of p rows and q columns. Adjacent sources 44 in each row p are displaced by a second period 46. Period 46 is perpendicular to thickness 18 and perpendicular to period 34. Adjacent sources 44 in each column q are displaced by period 34. Certain portions of my invention have been shown cut away for clarity. Every source 44 in each row p is straddled by a respective row electrode 32. Each Source 44 comprises a respective hole 48. Each hole 48 further includes a hole diameter 45. Each hole 48 extends through the respective row electrode 32 and insulating layer 26.

A field emissions cone 50 is located in each hole 48, the base of the cone 50 making contact with electrode 20 and a tip 52 of each cone 50 terminating in the plane of the respective row electrode 32. The tip 52 of each cone 50 terminates in the plane of first surface 40 of the respective row electrode 32. Materials utilizable for use as cones include molybdenum, diamond and AlN. Considerations involved in selecting a particular material for use as a field emitter array are provided in the references cited herein. See for instance information in the article titled "Applications of semiconducting diamond and Related Materials" by Max N. Yoder, SPIE Vol. 2151 Diamond Film Semiconductors (1994).

Although each source 44 is shown comprising a single hole 48, as identified in the patent application submitted by Craig D. Engle titled "Enhanced Electron Beam Addressed Storage Target", Ser. No. 08/180,037 filing date Jan. 18, 1994, the teaching of which are officially included herein by reference, each source can be configured to include a plurality of holes, with each hole comprising a respective cone.

Electrode 20 is electrically connected to an acceleration potential source 54. Source 54 applies a negative potential to electrode 20. The negative potential of source 54 is relative to a ground potential 56.

Transducer 10 further includes a row electrode sequencer 58. Sequencer 58 applies to each row electrode 32 a respective potential signal 60 in response to a controller command signal 62 supplied from a master clock circuit 64. Applying a respective potential signal 60 to each row electrode 32 establishes a potential difference between the row electrode 32 and electrode 20. In response to the potential difference applied between any row electrode 32 and electrode 20 by sequencer 58 due to signal 62 applied to sequencer 58 by circuit 64, each source 44 straddle by the row electrode 32 emits a plurality of electrons by a field emissions phenomena. Relationships which govern the quantity of electrons emitted by a field emissions cone 50, by a field emissions phenomena, as a function of the potential difference applied between electrodes associated with the cone are well understood by those knowledgeable in the state of the art. The current voltage characteristics of the quantity of electrodes emitted by a field emissions cone are described by the well known Fowler-Nordheim theory.

The row addressed field emitter array 12 of my invention imposes electrical conditions which activate every source 44 in the row p which is activated by sequencer 58 by applying a potential difference between the row electrode 32 and monolithic electrode 20. Utilizing the row addressed field emitter array of my invention avoids the requirement of having crossing conductors similar to the two degree of freedom XY addressed field emitter array of U.S. Pat. No. 5,196,767. Utilizing a row addressed field emitter array configuration of my invention simplifies construction of field emitter arrays.

As to be shown herein, utilizing the row addressed field emitter array configuration of my invention with a target which comprises a plurality of column conductors provides additional benefits. As identified in the patent application admitted to Craig D. Engle titled "Enhanced Electron Beam Addressed Storage Target" Ser. No. 08/183,037, filing date Jan. 18, 1994, the teachings of which are officially incorporated herein by reference, the arrangement of row electrodes and column conductors of my invention enables compensation for non uniformities in electron emissions from electron beam source arrays. Furthermore, the method of compensation available in my invention is compatible with gray scale operation. Such considerations are fundamental to enhancing reliability and performance capabilities of electron beam addressed storage target devices.

Array 12 is separated from a storage target 66 by a proximity focus distance 68. Distance 68 is parallel to thickness 18. Maintaining distance 68 relatively small enables electrons emitted from each source 44 of array 12 and accelerated toward target 66 to be proximity focused onto a ring hole 108 formed in a respective isolated metal ring 70 affixed to an insulating substrate 72. Relative geometry involving target 66 and array 12 establishes which ring 70 overlaps a particular source 44. Proximity focusing enables electrons to be concentrated onto a respective ring 70 overlapping the source 44 emitting the electrons. As to be described herein, concentration of electron beam charge and/or current density effects performance. Alternative focusing means exist and include the utilization of additional electrode structuring in array 12. Information concerning alternative focusing techniques is provided in the reference cited herein.

Electrons emitted from each source 44 and accelerated toward target 66 and focused onto hole 108 of a respective ring 70 form a respective electron beam which possess a current density of J amps/sq.cm. The electron beams are not shown in the figure. Due to the relative positioning of array 12 relative to target 66, electrons emitted from each source 44 and accelerated toward target 66, as to be further described herein, possess a velocity and/or propagate in a direction which is predominantly parallel to distance 68.

Substrate 72 further includes a first surface 74 essentially parallel to and separated from a second insulator surface by a substrate thickness 76. Thickness 76 is perpendicular to surface 74 and parallel to distance 68. Materials suitable for use as the insulating substrate in my invention includes mica and glass.

Substrate 74 further includes a first lateral dimension 78 parallel to period 34 and a second lateral dimension 80 parallel to period 46. Substrate 72 further includes a plurality of holes 82 arranged into a matrix of p rows and q columns. Each hole 82 further includes a diameter 84. Diameter 84 is perpendicular to thickness 76. Each hole 82 extends through substrate 72 from surface 74 to the second surface of substrate 72. Holes 82 are arranged into a matrix of p rows and q columns. Adjacent holes 82 in each row p are displaced by period 46. Adjacent holes 82 in each column q are displaced by period 34.

Affixed to surface 74 is a plurality of column conductors 86. Each conductor 86 further includes a first surface 88 essentially parallel to and separated from a second conductor surface by a conductor thickness 90. Thickness 90 is parallel to distance 68 and perpendicular to surface 88. Adjacent conductors 86 are displaced by period 46. Each conductor further includes a conductor width 92 parallel to period 46. Adjacent conductors 86 are separated by a conductor gap 94 parallel to period 46. Each conductor spans dimension 78.

Each conductor 86 further includes a plurality of conductor holes 96. Holes 96 further include a diameter 98 perpendicular to thickness 76. Adjacent holes 96 in each conductor 86 are displaced by period 34. Conductors 86 are positioned relative to substrate 72 so that each column q of holes 96 overlaps a respective column q of holes 82 in substrate 72. Holes 96 in each conductor 86 are positioned relative to a respective column q of holes 82 in substrate 72 so that each hole 96 in each conductor 86 overlaps and is concentric with a respective hole 82. Diameter 98 is selected to be equal to diameter 84.

Each ring 70 is affixed to the second surface of substrate 72. Each ring 70 further includes a first ring surface 100 essentially parallel to and separated from a second ring surface by a ring thickness 102. Surface 100 of each ring 70 is affixed to the second surface of substrate 72.

Ring hole 108 of each ring 70 posses an inside diameter 104 parallel to diameter 84. Each ring 70 further includes an outside diameter 106 parallel to diameter 84. Materials suitable for use as rings in my invention include conductive materials which are capable of providing a secondary electron emission ratio &p which exceed unity when bombarded with electrons of sufficient energy. Such considerations are well understood by those knowledgeable in the state of the art. Information concerning such considerations are identified in patent application Ser. No. 08/183,037. Materials utilizable for use as ring in my invention include silver and gold. Materials which are utilizable for use as rings in my invention includes platinum. Additional materials utilizable for rings in my invention include stainless steel coated with nickel.

Each ring 70 is positioned relative to a respective hole 82 so that the hole 108 in the ring 70 overlaps and is concentric with the respective hole 82. Diameter 104 is selected to be equal to diameter 84. Diameter 106 is equal to width 92. Conductors 86 are positioned on substrate 72 so each conductor 86 overlaps a column q of rings 70.

Each ring 70 forms with the localized portion of conductor 86 which overlaps the ring 70 and the portion of substrate 72 which includes the hole 82 which is concentric with hole 107 of the ring 70 and hole 96 in the localized portion of the conductor 86 which overlaps the ring 70 a respective capacitive pixel 109.

Separated from the second surface of substrate 72 by an offset distance 110 is an electron collector mesh 112. Distance 110 is parallel to distance 68. Mesh 112 is electrically connected to ground potential 56. Substrate 72 is positioned relative to array 12 so that each hole 82 overlaps a respective source 44.

Separated from surface 74 by a separation distance 122 is a read control plate 124. Distance 122 is parallel to distance 68. Plate 124 further includes a first surface 126 essentially parallel to and separated from a second surface of plate 124 by a plate thickness 128. Thickness 128 is perpendicular to surface 126 and parallel to distance 68. Plate 124 further includes a plurality of holes 130 arranged into a matrix of p rows and q columns. Each hole 130 further includes a hole diameter 132 perpendicular to thickness 128. Adjacent holes 130 in each row p are displace by period 46. Adjacent holes 130 in each column q are displaced by period 34. Plate 124 is positioned relative to substrate 72 so that each hole 130 overlaps a respective hole 82 in substrate 72.

Plate 124 is electrically connected to a first switch terminal 134 of a first switch 136. Switch 136 further includes a second terminal 138. Terminal 138 is electrically connected to a negative potential source 140 which applies to terminal 138 a negative potential relative to ground 56. Switch 136 further includes a third switch terminal 142. Terminal 142 is electrically connected to a positive potential source 144 which applied to terminal 142 a positive potential relative to ground terminal 56. Circuit 64 applies a switch control signal 146 to a switch control terminal 145 of switch 136 to control whether terminal 134 is electrically connected to terminal 138 or terminal 142. When terminal 134 is electrically connected to terminal 138 the switch is in the first state. When terminal 134 is electrically connected to terminal 142 the switch 136 is in the second switch state. Switch 136 is shown in the second switch state in the figure.

Separated from plate 124 by a separation distance 148 parallel to distance 68 is a transmissive faceplate 150 of a luminous target assembly 155. Faceplate 150 further includes a first surface 152 essentially parallel to and separated from a second faceplate surface by a faceplate thickness 154. Thickness 154 is parallel to thickness 68 and perpendicular to surface 152. Assembly 155 further includes a transmissive monolithic conductor 156 affixed to the second surface of faceplate 150. Conductor 156 further includes a first surface 158 essentially parallel to and separated from a second conductor surface by a conductor thickness 160. Conductor 156 is electrically connected to a second acceleration potential source 162.

Assembly 155 further includes a phosphor layer 164 affixed to the second surface of conductor 156. Layer 164 further includes a first phosphor surface 166 separated from a second phosphor surface by a phosphor thickness 168.

Each conductor 86 is electrically connected to a first terminal 170 of a respective electronic column switch 172. Each switch 172 further includes a second terminal 174. Terminal 174 of each switch 172 is electrically connected to a function generator 176. Each switch 172 further includes a third terminal 178. Third terminal 178 of each switch 172 is electrically connected to ground terminal 56. Each switch 72 further includes a control terminal 180. A series in parallel out shift register 182 applies a respective control signal 184 to terminal 180 of each switch 172. Applying a respective signal 184 to terminal 180 of each switch 172 determines whether terminal 170 of the switch 172 is electrically connected to terminal 174 or terminal 178 of the switch 172.

When terminal 170 of a switch 172 is electrically connected to terminal 174 of the switch, the switch is said to be in the first switch state. When terminal 170 of a switch 172 is electrically connected to terminal 178 of the switch 172 the switch 172 is said to be in the second switch state. Each switch 172 is shown with terminal 170 electrically connected to terminal 178 in the figure for convenience.

An information bearing signal 186 is applied to register 182 and circuit 64. Circuit 64 applies a register control signal 188 to register 182. Circuit 64 applies a function control signal 190 to generator 176 enabling circuit 64 to synchronize the operation of generator 176 with register 182 and sequencer 58. Use of switches, shift register and function generator is a potential control means for applying to each column conductor a respective potential relative to ground potential.

Signal 188 enables register 182 to latch and transform samples of signal 186 into a corresponding control signal 184. Circuit 64 is a synchronization means to synchronize application of signal 62 with signal 190 and signal 146 and signal 188. As to be shown herein, synchronization of these signals is essential for operation of display 10. Timing associated with operation of display 10 will be discussed herein.

Signal 186 is sampled in response to clock signal 188 and the samples obtained from signal 186 are then collectively applied to terminal 180 of a respective switch 172 as the control signal 184. Use of switches 172, register 182, generator 176 and the associated control and/or input signals forms a potential control means 192 for applying to each column conductor a respective potential relative to ground potential 56.

The timing and signal characteristics associated control means 192 and method of operation of display 10 will now be discussed. A writing phase of the operation of the display 10 is utilized to deposit an electronic charge quantity on the ring 70 of each pixel 109 in target 66 which is dependent on the potential difference existing between the column conductor 86 of the pixel 109 and mesh 112 during bombardment of the pixel 109 with electrons. As to be described herein, during the write phase of operation, pixels 109 in target 66 are bombarded on a row at a time basis.

Figure 2A:
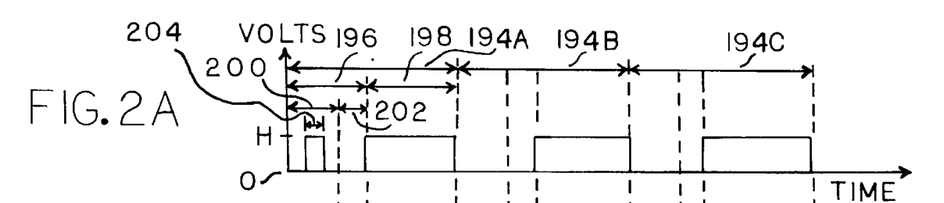
FIG. 2A shows a timing diagram associated with the operation of my invention.
Figure 2B:
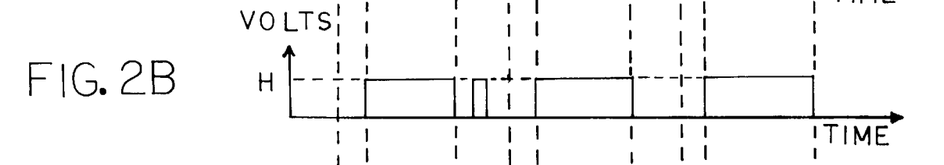
FIG. 2B shows a timing diagram associated with the operation of my invention.
Figure 2C:
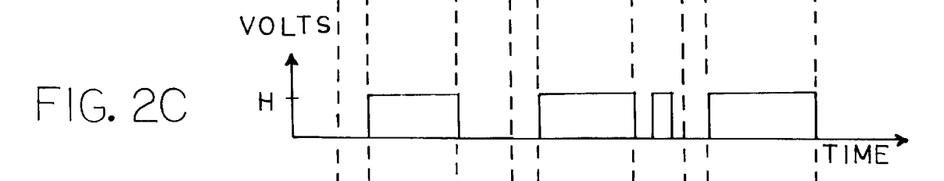
FIG. 2C shows a timing diagram associated with the operation of my invention.

FIG. 2A shows the potential difference in volts existing between row electrode 32A and the monolithic electrode of the field emitter array as a function of time. FIG. 2B shows the potential difference in volts existing between row electrode 32B and the monolithic electrode of the field emitter array as a function of time. FIG. 2C shows the potential difference in volts existing between row electrode 32C and the monolithic electrode of the field emitter array as a function of time. The field emitter array is not shown in FIGS. 2A thru 2C. FIGS. 2A thru 2C have been time phased relative to a common origin O to facilitate understanding of my invention.

Figure 2D:
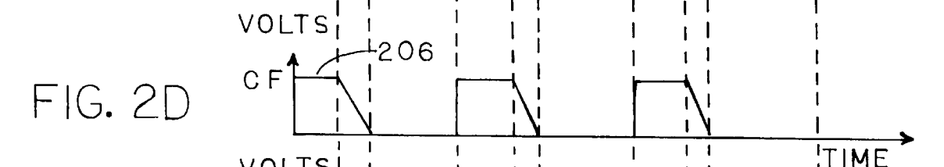
FIG. 2D shows a timing diagram associated with the operation of my invention.
Figure 2E:
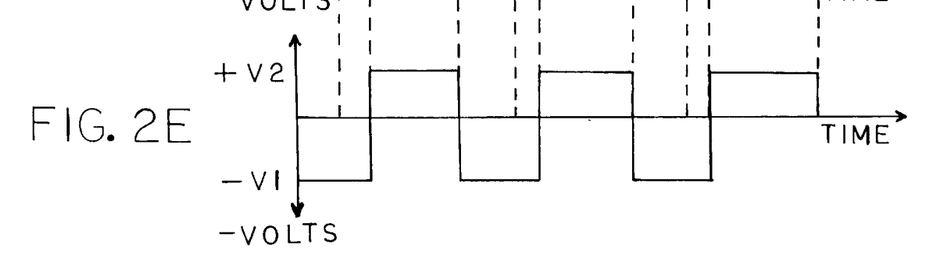
FIG. 2E shows a timing diagram associated with the operation of my invention.

FIG. 2D shows the potential generated by the function generator relative to ground potential as a function of time. The function generator is not shown in this figure. FIG. 2E shows the potential in volts applied to the read plate, relative to ground potential, as a function of time. FIGS. 2D and 2E have been time phased relative to origin O of FIG. 2A to facilitate understanding of my invention. The read plate is not shown in the figure.

Three consecutive line periods labeled 194A thru 194C are shown in FIG. 2A. Each period 194 comprises blanking interval 196 and an active interval 198. Each interval 196 comprises a voltage control interval 200 and a sloping interval 202.

During blanking interval 196 of each line period 194, the potential of the ring of each pixel in a select one of the rows p of pixels in the target is shifted to either essentially the potential applied to the monolithic electrode of the field emitter array or approximately ground potential applied to the electron collector mesh. This is achieved in a two step process.

As identified in FIG. 2D, during blanking interval 196 of each period 194, due to the clock circuit applying the function control signal to the function generator, the function generator develops a potential shifting waveform 206. Waveform 206 maintains a constant signal level of CF volts during interval 200. During interval 202 of each period 194, Waveform 206 ramps from the level of CF volts to zero volts at a constant rate. During all other times, the function generator supplies a potential of zero volts.

Returning to FIG. 1, the state of the switch 172 electrically connected to each column conductor 86 determines whether the column conductor 86 is electrically connected to function generator 176 or to ground potential 56. If any switch 172 is placed in the first state by the control signal 184 applied to terminal 180 of the switch 172, in response to signal 188 being applied to register 182 by circuit 64, then the potential applied to the column conductor 86 electrically connected to that switch 172 is the potential generated by function generator 176.

If any switch 172 is placed in the second state by the control signal 184 electrically connected to terminal 180 of the switch 172 due to operation of register 182 in response to signal 188 applied to register 182 by circuit 64, then the potential applied to the column conductor 86 electrically connected to that switch 172 is maintained at ground potential. Due to timing associated with the operation of register 182 due to signal 188 applied by circuit 64 of my invention, control signals 184 which determine the state of respective switches 172 are applied to terminal 180 of respective switches 172 at the beginning of the blanking interval associated with each line period. Operation of shift registers and circuitry necessary to perform the transfer operations described herein are well understood by those knowledgeable in the state of the art. Accordingly, register 182 is shown in a simplified fashion.

As identified in FIG. 2A a bombardment sub interval 204 exists during the interval 200 of each period 194. As identified in FIGS. 2A thru 2C, during sub-interval 204 of each period 194, in response to the signal applied to the sequencer by the clock circuit, the sequencer applies between a select one of the row electrodes and the monolithic electrode of the field emitter array a potential difference enabling emissions of electrons from the sources straddled by the selected row electrode. Synchronization of the timing associated with operation of the potential control means with the scan means is provided by the clock circuit.

Returning to FIG. 1, the material utilized for fabricating rings 70 is selected so the secondary electron emissions ratio of the ring 70 can exceed unity when bombarded with primary electrons of sufficient energy. This permits the utilization of a high velocity mode of equilibrium writing when bombarding rings 70 of my invention with electrons emitted from array 12 and striking rings 70. The electron charge density of the electron beam emitted from the source 44 overlapped by hole 108 of the pixel 109 containing the hole 108 will be of such a nature that some portion of the electron beam will strike ring 70 surrounding the hole 108. The potential applied to electrode 20 of array 12 by source 54 is selected relative to ground potential 56 applied to mesh 112 to accelerate electrons emitted from the sources 44 of array 12 toward target 66 with a primary energy which lies between the first crossover point and the second crossover point of the curve of secondary electron emission ratio versus primary energy for the material utilized for the rings 70 in my invention. This results in a high velocity mode of equilibrium writing. Establishing a potential difference between electrode 20 and mesh 112 is an acceleration means for accelerating electrons emitted from array 12 toward target 66.

Due to utilizing a high velocity mode of equilibrium writing, the potential of the ring 70 of each pixel 109 in the row p of pixels 109 which overlaps the row of sources 44 emitting electrons during the bombardment sub-interval of a particular line period will be shifted to an equilibrium potential Veq dependent upon ground potential 56 applied to mesh 112. In addition, the potential applied to the column conductor 86 overlapping the pixel 109 during bombardment of the pixel 109 with electrons during the bombardment sub-interval of the period influences the potential difference which exists across the pixel 109 after bombardment with electrons.

If the switch 172 electrically connected to the column conductor 86 is placed in the first state at the beginning of the blanking interval by the control signal 184 from register 182, then the potential difference existing across the pixel 109 upon completion of the bombardment sub-interval is related to CF, the magnitude of the potential applied to the column conductor 86 overlapping the pixel 109 by the function generator 176 during the bombardment sub-interval when the pixel 109 is bombarded with electrons. For reasons to be described herein, the magnitude of CF is selected to be approximately equal to the magnitude of the potential relative to ground 56 applied to electrode 20 by source 54.

As identified in FIG. 2E, during blanking interval 196 of each line period 194, the switch electrically connected to the read plate applies a potential of −V1 volts to the read plate. −V1 volts is selected to be more negative than the potential applied to the monolithic electrode of the field emitter array by the acceleration potential source. Applying this potential to the read plate prevents any electrons emitted during sub-interval 204 of any period 194 from reaching the phosphor layer during the blanking sub-interval.

As identified in FIGS. 2A thru 2C, during each sloping interval 202, a zero potential difference is applied between each row electrode and the monolithic electrode of the field emitter array preventing emissions of electrons from any source in the array. Returning to FIG. 1, consequently, for any column conductor 86 which is electrically connected to function generator 176 as the potential of generator 176 ramps from CF volts to zero volts, the potential of the ring 70 of the pixel 109 overlapped by the column conductor 86 and bombarded with electron during the prior bombardment sub-interval will shift potential from essentially ground potential 56 established during the prior bombardment sub-interval to a potential of CF volts negative relative to ground 56 due to capacitive coupling.

If any switch 172 is placed in the second state by the control signal 184 applied by register 182 to the terminal 180 of the switch 172 at the beginning of the blanking interval, then upon completion of the bombardment sub-interval, the potential difference existing across the pixel 109 will be essentially zero volts. Since the potential applied to a column conductor 86 electrically connected to a switch 172 in the second state is maintained constant at ground potential 56 during the blanking interval, the potential of the ring 70 of the pixel 109 overlapped by a column conductor 86 maintained at ground potential will not shift from the equilibrium potential Veq related to ground potential 56 established during the prior bombardment sub-interval. Consequently, the potential of the ring 70 of the pixel 109 is maintained at essentially ground potential 56.

As identified in FIG. 2D, in response to the signal applied to the function generator by the clock circuit of my invention, the function generator applies a potential of zero volts during the active interval 198 of each period 109. In addition, if any column conductor is electrically connected to a switch which is in the second switch state, then the column conductor is maintained at ground potential. Therefore, regardless of the switch state, all column conductors have a potential of zero volts applied to the conductor during the active interval 198 of each period.

Returning to FIG. 1, accordingly, during the blanking interval of each line period, the potential of the ring 70 of each pixel 109 which overlaps the row of sources 44 which emits electrons during the bombardment sub-interval of that period can be shifted to either the potential 56 applied to mesh 112 depending upon the potential difference applied between the column conductor 86 overlapping (comprising) the pixel 109 and mesh 112 during bombardment of the pixel 109 with electrons.

Accordingly, use of a plurality of row electrodes 32 overlapping a monolithic electrode 20 with a plurality of sources 44 operatively associated with each row electrode 32 and electrode 20 with sequencer 58 to apply a respective potential differences between each row electrode 32 and the monolithic electrode 20 is a scan means 53 for selecting which rows p of pixels 109 in the target 66 are to be bombarded with electrons emitted from the sources 44. Use of a proximity focusing technique by restricting the magnitude of distance 68 enables electrons emitted from sources 44 in the selected row p of sources 44 and accelerated toward target 66 to bombard a respective pixel 109 in the row p of pixels overlapping the row of sources 44 emitting electrons. This is feasible since the proximity focus techniques restricts distance 68 which limits, or concentrates the lateral spread of electrons in the elctron beam thereby enabling each electron beam to converge to the pixel 109 overlapping the source 44 emitting the electrons.

A reading phase of operation associated with target 66 of display 10 is performed during the active line interval of each line period. As identified in FIGS. 2A thru 2C, during active interval 198 of each period 194, in response to the signal applied to the sequencer by the clock circuit, the sequencer applies between each row electrode and the monolithic electrode of the field emitter array a respective potential difference enabling field emissions of electrons from all sources in the array. This is a flood mode of operation. In addition, as identified in FIG. 2E, during the active interval 198 of each period 194, a potential of +V2 volts is applied to the read plate. The value of +V2 is more positive relative to the potential applied to the monolithic electrode of the field emitter array by the acceleration potential source.

Returning to FIG. 1, the potential of ring 70 of each pixel 109 in target 66 enables target 66 to function as a transmission grid to control the flow of electron through each pixel 109 of target 66. If the potential of the ring 70 of any pixel 109 has been shifted to essentially the potential applied to electrode 20 of array 12, then primary electrons which are emitted by the source 44 which is overlapped by hole 108 of the pixel 109 containing the ring 70 during subsequent active intervals will arrive at the ring 70 with essentially zero energy and no current will pass through the pixel 109. By selecting the magnitude CF of the potential generated by function generator 176 during the bombardment sub-interval to be essentially equal to the magnitude of potential of source 54, it is possible to prevent electrons from flowing through particular pixels 109 in target 66 during subsequent active intervals.

However, if the potential of the ring 70 of any pixel 109 has been shifted essentially to ground potential 56 by prior write operations, then electrons emitted from the source 44 which is overlapped by the pixel 109 containing the ring 70 will reach the pixel 109 with an energy sufficient to pass through the hole 108 of the pixel 109. The energy of electrons reaching the pixel 109 will correspond to approximately the magnitude of the potential applied to electrode 20 and will be able to pass through hole 108 of the pixel 109. Electrons which pass through hole 108, hole 82 and hole 96 of the pixel 109 are accelerated toward plate 124 due to the potential applied to plate 124 by switch 136 relative to the potential applied to electrode 20 by source 54 during the active interval.

Electrons which are accelerated toward plate 124 pass through the hole 130 which overlaps the pixel 109 emitting the electrons and are accelerated toward layer 164 due to the potential applied to conductor 156 by source 162 and strike layer 164 at a corresponding light spot 169 which overlaps the pixel 109 emitting the electrons bombarding the spot 169. The brightness associated with the luminous flux emitted by light spots 169 due to bombarding layer 164 with electrons emitted from a respective pixel 109 and accelerated toward layer 164 is attributed to a cathodoluminescence effect associated with the material properties of layer 164. Only one spot 169 is shown in the figure for convenience.

Persistence effects associated with the brightness of light spots 169 are selected to complement the reading operation of display 10. Since reading operations of each row of pixels occur during the active interval of each line period due to a flood mode of operation which involves applying a potential difference between each row electrode and the monolithic electrode enabling electrons to be emitted from every source in the array, use of a quick decay type phosphor can be utilized to avoid image lag. Using an electron beam flood mode of reading in which each row of pixels is bombarded with electrons during the active interval of each line period enables the average brightness of the light spots to be high, thereby avoiding the need for a long persistence effect associated with the cathodoluminescence of the light spots to enhance average brightness. The food mode of my invention provides the ability to avoid image lag. This is an important consideration in enhancing the performance of my invention over prior art.

The electronic charge quantity deposited on the ring 70 of a respective pixel 109 during bombardment of the ring 70 with electrons produces a corresponding electrostatic field in the neighborhood of hole 108 of the ring 70. The electrostatic fields produced by the stored charge are able to control, by coplanar grid action, the number of electrons penetrating the hole 108. An electron lens action is associated with the electrostatic field associated with hole 108 of each ring 70. The electrostatic fields are not shown in the figure. Relationships which described the characteristic of an aperture plate functioning as an electron lens associated with a transmission modulation reading technique are well understood by those knowledgeable in the state of the art. See for instance information in the book titled "Electronic Image Storage" by B. Kazan, M. Knoll. Use of my invention enable the transmission characteristics of the transmission grid to be updated on a row at a time basis.

The potential of the ring 70 of each pixel 109 during the active interval of each line period influences the brightness of the spot 169 overlapping the pixel 109. If the potential of the ring 70 is shifted to essentially the same potential applied to electrode 20 by selecting the magnitude of CF to be essentially equal to the magnitude of the potential applied to electrode 20, then no electrons will be emitted from the pixel 109 during subsequent active intervals and no light will be emitted from the spot 169 overlapping the pixel 109. Alternatively, if the potential of the ring 70 of a pixel 109 is shifted to essentially ground potential 56, then in subsequent active line intervals electrons will be emitted from the pixel 109 enabling the spot 169 overlapping the pixel 109 to be bombarded with electrons emitted from the pixel 109 thereby emitting light by a cathodoluminescence effect associated with the phosphor layer.

Accordingly, information bearing signal 186 is encoded with a sequence of binary control signals to shift the potential of the ring 70 of a corresponding pixel 109 to one of two levels in order to control the light emitted by the spot 169 overlapping the pixel 109 containing the ring 70. Use of register 182 facilitates row at a time writing operations associated with my invention.

Use of my invention enables an electronic charge quantity to be deposited at the ring of each pixel on a row at a time basis using electron beam addressing. The charge deposited on the ring of each pixel in the row of pixels being bombarded with electrons during the bombardment sub-interval is collectively accumulated by the pixels in the row p of pixels being bombarded with electrons.

By utilizing row at a time addressing of the storage target, my invention provides several enhancements over serially scanned devices. Benefits of row at a time addressing include increasing the duration of the bombardment sub-interval, or conversely, the capability to increase the line rate (reducing the duration of the line period) given a particular frame time an format i.e. the number of rows in the display. Such considerations are fundamental to utilizing sub frame addressing techniques to implement a pulse width modulated mode of operation.

My invention utilizes an electron source array positioned relative to the storage target which enables electrons emitted by the sources of the array to travel in a direction and/or with a velocity which is essentially or predominantly perpendicular to the plane of the storage target which is bombarded with elections. Due to this feature of my invention, it is feasible for each pixel in the storage target to overlap a respective electron beam source without impeding other functions necessary to coordinate bombardment of all pixels in the target during a flood mode of operation. Other functions necessary to coordinate bombardment of all pixels in the target include a focusing means and an acceleration means. As identified herein, proximity focusing is compatible with the row addressed array and acceleration means of my invention.

Utilizing the sequencer to apply potential differences between selected row electrodes and the monolithic electrode of the field emitter array to enable electrons emitted from sources in the selected rows to bombard corresponding rows of pixels in the target is a scan means to define which rows of pixels are to be bombarded with electrons from the row addressed field emitter array. Use of the focus means enable electrons emitted from the sources and accelerated by the acceleration means to be concentrated on the regions of the target selected by the scan means. As to be shown herein, alternative can means are available with electrons emitted from row addressed sources which travel in a direction predominantly perpendicular to the target.

Furthermore, the embodiment of FIG. 1 of my invention enable the realization of a flood mode of operation from the field emitter array. This flood mode of operation of my invention is also compatible with row at a time addressing of the source array. The electron beam flood mode of operation is not available in alternative row addressed electron beam storage targets such as U.S. Pat. No. 5,036,317. This limitation of U.S. Pat. No. 5,036,317 is attributed to utilizing an electron source and storage target geometry in which electrons emitted from the linear source array travel in a direction which is essentially parallel to the plane of the storage target. Once the deflection means of U.S. Pat. No. 5,036,317 has deflected the electron beam to a particular second stripe region as cited in U.S. Pat. No. 5,036,317, electrons are no longer available to addressed second stripe regions which lie further from the source than the second stripe region being bombarded with the electrons emitted from the source. As can be seen from the information provided herein, there are fundamental performance advantages associated with my invention as compared to prior art. Additional advantage of my invention have been identified in the cited copending applications.

Since bombardment of each corresponding spot occurs for the active interval of each line period for a pixel which is shifted to essentially the same potential applied to the electron collector mesh, the duty cycle of electron bombardment at such a spot is relatively high as compared to prior art row addressed storage targets which prevent the use of a flood mode of operation.

Utilizing the information provided herein, it will be evident to those knowledgeable in the state of the art that sub frame addressing of display can be utilized as a means to control the brightness of each corresponding spot. Utilizing a row addressed field emitter array facilitates a pulse width modulated mode of operation associated with electron bombardment since a complete row of pixels can be updated collectively on a row at a time basis. This enables each pixel in the row p being bombarded with electrons to be bombarded for a longer duration. Conversely, my invention enables more pixels to be addressed for the same dwell time when compared to serial electron beam scanning. In addition, the row addressed field emitter array of my invention is capable of providing a high electron beam current density.

Applicant notes that the dwell time of my invention can be a high percentage of the frame time thereby providing the display device considerable latitude for utilizing dwell time to compensate for source non uniformities. For sources which exhibit a higher than normal electron emission, sub frame addressing is utilized to reduce the dwell time and consequently the corresponding light spot brightness. For sources which exhibit a lower than normal electron emissions, the dwell time is increased thereby increasing the corresponding light spot brightness.

Although the display device of FIG. 1 utilized a flood mode of operation, row at a time addressing can be utilized during the active line interval of each line period.

Figure 3:
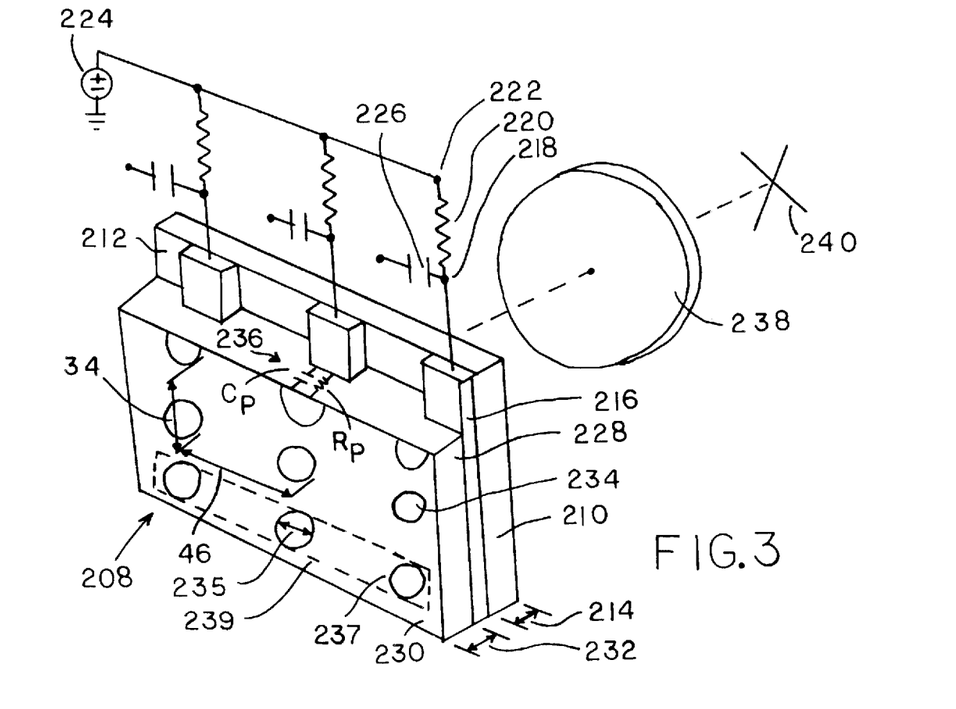
FIG. 3 shows a photoconductive charge storage target comprising a plurality of column conductors.

FIG. 3 shows a photoconductive target 208. Target 208 further includes a transmissive faceplate 210. Materials utilizable for faceplate include glass. Faceplate 210 further includes a second faceplate surface 212 essentially parallel to and separated from a first faceplate surface by a faceplate thickness 214. Thickness 214 is perpendicular to surface 212. The first faceplate surface is not visible in the figure. Affixed to surface 212 is a plurality of transmissive, highly transparent column conductors 216. Materials suitable for use as transmissive column conductors include ITO.

Electrically connected to each conductor 216 is a first terminal 218 of a respective resistor 220. A second terminal 222 of each resistor 220 is electrically connected to a fixed potential source 224. Electrically connected to terminal 218 of each resistor 220 is a respective signal coupling capacitor 226. Each capacitor 226 is electrically connected to a respective amplifier. The amplifiers are not shown in the figure.

Adjacent to and in contact with each conductor 216 is a glassy photoconductive substrate 228. Substrate 228 further includes a second photoconductive surface 230 essentially parallel to and separated from a first photoconductive surface by a photoconductor thickness 232. Thickness 232 is perpendicular to surface 230 and parallel to thickness 214. The first surface of substrate 228 is not visible in the figure.

The photoconductive substrate is a glassy type photoconductor which is capable of generating a secondary electron emissions ratio greater than unity when bombarded with electrons of sufficient energy. Material suitable for use as a photoconductor substrate in my invention include glassy layer of amorphous antimony trisulfide. Additional information is provided in the article titled "The High Beam Velocity Vidicon" by J. Dresher, RCA review, June 1961. Photoconductors sensitive to the infrared portion of the electromagnetic spectrum are also utilizable with my invention.

A plurality of electron beam landing areas 234 identify the area on target 208 which are bombarded with electron emitted from a respective electron beam source which is overlapped by the area 234. The electron beam sources are not shown in the figure for convenience. Each area 234 further includes a diameter 235. The area of each area 234 is related to diameter 235 of the area 214. Areas 234 are shown as circular with an external boundary 237 for convenience. The exact shape of boundary 237 which define the lateral extent of the electron density of electrons bombarding the area 234 depends on several factors including the spatial distribution of cones in the electron source.

A respective capacitive pixel 236 is formed where each conductor 216 overlaps an area 234. Each pixel 236 comprises the column conductor 216 which overlaps the area 234, the portion of substrate 228 located between the column conductor 216 overlapping the area 234 and the area 234. Pixels 236 are arranged into a matrix containing p rows and q columns.

Substrate 228 further includes a dielectric constant Epc. Each pixel 236 is modeled as a capacitor Cp in parallel with a variable resistor Rp, with the value of Rp dependent upon the irradiance incident on the column conductor 216 of the pixel 236. Target 208 further includes an electron collector mesh. The collector mesh is not shown in the figure for convenience.

Adjacent areas 234 in each row p of areas 234 are displaced by period 46. Adjacent areas 214 in each column q are displaced by period 34. The areas 234 in each row p form a respective second stripe region 239 on target 208. Region 329 overlaps each conductor 216. Only one outline of a region 239 is shown in the figure. Each conductor 216 traverse each region 239.

An imaging lens 238 is utilized to focus radiant power emitted from an object 240 onto target 208. Determination of the spatial distribution of irradiance on target 208 created by lens 238 and an object 240 are well understood by those knowledgeable in the state of the art and therefore lens 238 and object 240 are not shown in detail.

Figure 4A:
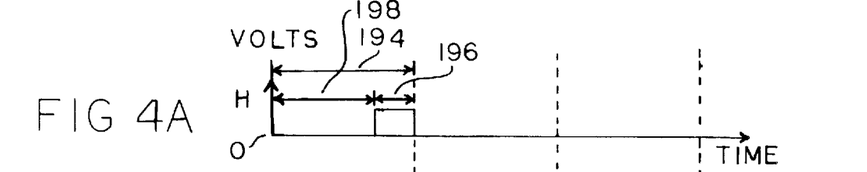
FIG. 4A shows a timing diagram associated with the operation of my invention.
Figures 4B, 4C:
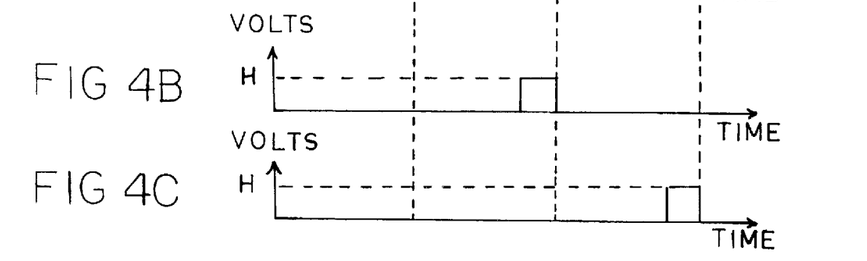
FIG. 4B shows a timing diagram associated with the operation of my invention.
FIG. 4C shows a timing diagram associated with the operation of my invention.

Target 208 is capable of being bombarded with electrons generated by the row addressed field emitter array shown in FIG. 1. The field emitter array is not shown in FIG. 8. FIGS. 4A thru 4C shows time lines of operations for use with the storage target identified in FIG. 3. FIG. 4A shows a potential difference of H volts applied between a first row electrode and the monolithic electrode of a field emitter array as a function of time. FIG. 4B shows a potential difference of H volts applied between a second electrode and the monolithic electrode of a field emitter array as a function of time. FIG. 4C shows a potential difference of H volts applied between a third row electrode and the monolithic electrode of a field emitter array as a function of time. FIGS. 4A thru 4C have been time phased relative to a common origin O to facilitate understanding of my invention.

FIGS. 4A thru 4C show three consecutive line periods 194. During active interval 198 of each period 194, the sequencer applies a potential difference of zero volts between each row electrode and the monolithic electrode of the field emitter array. This terminates electron emissions from the sources of the array. During blanking interval 196 of each period 194, the sequencer applies a potential difference between a select one of the row electrodes and the monolithic electrode of the field emitter array of H volts.

FIGS. 4A thru 4C show a consecutive sequence of applying a potential difference between each row electrode and the monolithic electrode of the field emitter array. Use of my invention enables an increase of the duration in which an electron beam bombards a respective location on the storage target over serially scanned devices. As identified in application Ser. No. 08/183,037, such considerations are fundamental to enhancing performance.

Furthermore, increasing the duration of electron bombardment and utilizing an equilibrium writing means enables compensation to be extended to non uniformities in field emission devices. This feature is available in my invention while eliminating XY electrode patterning requirements associated with alternative field emitter array devices indicating the synergism that is present in my invention.

Returning to FIG. 3, bombarding each region 239 of target 208 on a row at a time basis with electrons from a row addressed field emitter during the blanking interval of each line period with high velocity electrons will shift the potential of the portion of surface 230 which coincides with areas 234 comprising the region 239 being bombarded with electrons toward an equilibrium potential. Shifting the portion of surface 230 corresponding to an area 234 being bombarded with electrons will shift the area 234 toward an equilibrium potential which creates a corresponding signal in the resistor 220 electrically connected to the column conductor 216 which overlaps the area 234 which is being bombarded with electrons. The voltage drops occurring across each resistor 220 an be utilized to create a video signal by use of a shift register, amplifiers, and clock generators, etc. The shift register, amplifiers, and master clock generator are not shown in the figure for convenience.

Shifting each area 234 to an equilibrium potential results in an electronic charge quantity being deposited on the area 234 which is dependent on the potential applied to the column conductor 216 overlapping the area 234. An electronic charge quantity deposited at an area 234 establishes a respective electric field in the pixel 236 containing the area 234. Due to geometric consideration in target 208, each respective electric fields in target 208 and the electronic charge quantity are not shown for convenience.

During the active interval of each line period, charge which was previously deposited on an area 234 will "leak" from surface 230 at a rate dependent on the value Rp of the pixel 236 comprising the area 234 to the conductor 216 which overlaps the area 234. Irradiance projected onto the pixel 236 by lens 238 during the active interval of each line period produces conductivity variations in the localized portion of substrate 228 contained in the pixel 236. These conductivity variations are represented by Rp with the value of Rp of the pixel 236 being dependent on the irradiance incident on the pixel 236. The value of Rp enables charge which was deposited during bombardment of the area 234 with electrons to leak (transfer) from the area 234, at a rate dependent on the value Rp, to the conductor 216 which overlaps the area 234. This charge transfer shifts the potential of the portion of surface 230 which coincides with area 234 of the pixel 236 away from the equilibrium value, the potential shift being dependent upon the irradiance level incident on the pixel 236.

During the blanking interval of the line period in which the area 234 is returned to equilibrium potential Veq, the electrons bombarding the area 234 will deposit an electronic charge quantity on the area 234 to shift the area 234 to the equilibrium potential Veq. This generates a current flow in the resistor 220 electrically connected to the column conductor 216 which overlaps the pixel element 236 which is related to the resistance of Rp of the pixel 236 comprising the area 234. In this manner, a video signal is generated on a row at a time basis.

Figure 5:
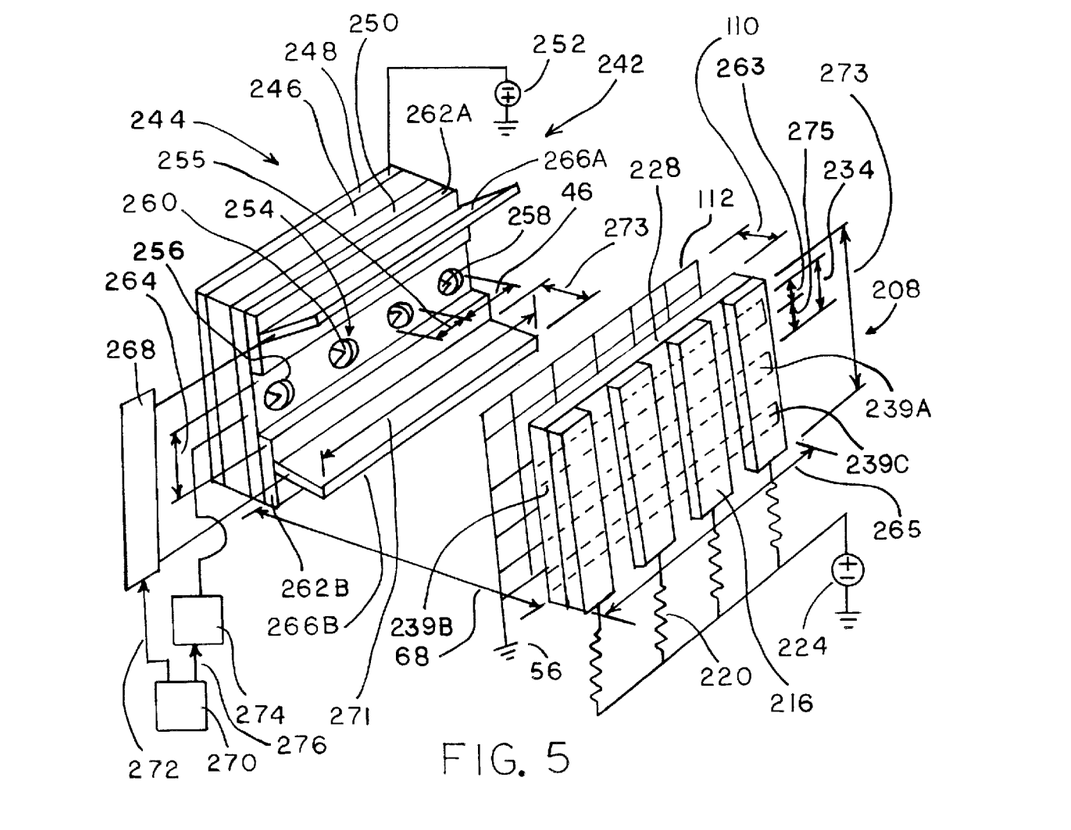
FIG. 5 shows an image transducer which utilizes row at a time electron beam scanning with an electron beam source array which emits electrons that travel in a direction which is predominantly perpendicular to the photoconductive storage target.

FIG. 5 shows an imaging transducer 242 comprising a row addressed linear field emitter array 244 and a photoconductor target 208. Array 244 further includes an insulating layer 246 disposed between a first electrode 248 and a second electrode 250. Electrode 248 is electrically connected to an acceleration potential source 252.

Array 244 further includes a plurality of electron beam sources 254. Adjacent sources 254 are displayed by period 46. Each source 254 further includes a hole 256. Each hole 256 extends through conductor 250 and insulator 246. Each hole 256 further includes a diameter 255. A field emission cone 258 is located in each hole 256. A tip 260 of the cone 258 terminates in the plane of conductor 250 and a base of the cone 258 is in electrical contact with electrode 248. The base of the cones 258 are not visible in the figure.

Applying a potential difference between electrode 248 and electrode 250 results in electrons being emitted from the cone 258 of each source 254 by a field emissions phenomena. Operation of array 244 is similar to a single row of the row addressed field emitter array of FIG. 1.

Offset from array 244 by a proximity focus distance 68 is target 208 comprising a plurality of transparent column conductors 216 affixed to photoconductive substrate 228. The faceplate of target 208 is not shown in the figure. Electrically connected between each column conductor 216 and a potential source 224 is a respective series resistor 220. Electrically connecting each column conductor to a series resistor which is electrically connected to a voltage source is a potential control means to apply to each conductor a respective potential. Offset from substrate 228 by distance 110 is mesh 112. Mesh 112 is electrically connected to ground potential 56.

Affixed to electrode 250 is a pair of insulating layers 262. Layers 262 are separated by a gap 264. Gap 264 is perpendicular to distance 68 and perpendicular to period 46. Gap 264 overlaps sources 254 thereby enabling electrons emitted from each source 254 in array 244 to travel toward target 208 in a direction essentially parallel to distance 68 unobstructed by layers 262. Substrate 228 is perpendicular to distance 68. This geometric arrangement of my invention enables electrons emitted from array 244 to be emitted in a direction which is essentially perpendicular to target 208.

Affixed to each layer 262 is a respective conductive electron deflection plate 266. Each plate 266 is electrically connected to an phase splitting amplifier 268. A control circuit 270 applies a deflection drive signal 272 to amplifier 268. Each plate 266 spans a first lateral dimension 271 of array 244. Dimension 271 is parallel to period 46. Each plate 266 further includes a second plate dimension 273 perpendicular to dimension 271.

Electrode 250 is electrically connected to a row drive amplifier 274 to enable a potential difference to be established between electrode 250 and electrode 248 in response to an electron source current control signal 276 applied to amplifier 274 by circuit 270. As previously identified, applying to amplifier difference between electrode 250 and electrode 248 of array 244 results in electrons being emitted from each source 254 in array 244.

Due to the potential difference existing between the potential applied to conductor 248 by source 252 and ground potential 56 applied to mesh 112, electrons emitted from sources 44 in response to signal 276 are accelerated toward target 208. In addition, the primary energy of the electrons accelerated toward target 208 have a primary energy which enables the number of secondary electron emitted per incident primary electron of substrate 228 to exceed unity. Due to relative positioning between target 208 and array 244, each column conductor 216 overlaps a respective source 244. Each conductor 216 extends along a target dimension 273 parallel to gap 264.

With a potential difference of zero volts applied between plate 266A and plate 266B by amplifier 268 in response to signal 272, the trajectories of the electrons emitted from sources 254 will remain unaltered and bombarded with second strip region 239A which overlaps the row of sources 254. Three regions 239 labeled 239A thru 239C are shown on target 208. Adjacent regions 239 are displaced by period 34. Each region 239 further includes a first lateral dimension 263 parallel to gap 264. Each region 239 further includes a second lateral dimension 265. Dimension 265 is parallel to and equal to dimension 271. Adjacent regions 239 are separated by a gap 275. Due to the relative positioning of target 208 and array 244, each column conductor 216 overlaps a respective source 254 in array 244. In addition, each conductor 216 overlaps each region 239.

Applying a potential difference between the deflection plates 266 establishes an electrostatic field between plate 266A and plate 266B. An electrostatic field existing between plate 266A and plate 266B applies a force component to the electrons emitted from each source 254 of array 244. The force component attributed to the electrostatic field generated between the deflection plates 266 acting on electrons emitted from the sources 254 enables the direction of travel of the electrons to be altered, enabling the beam landing areas associated with the electrons emitted from each source 254 to be displaced in a direction parallel to gap 264 along the column conductor 216 which overlaps the source 254 emitting the electrons.

The direction of displacement of the beam landing area due to the presence of electric field existing between the deflection plates 266 on target 208 is in a direction parallel to gap 264. The magnitude of the displacement from center region 239A is dependent upon the magnitude of the potential difference applied between the deflection plates 266. The polarity of the potential difference determines whether the electrons are displaced in a direction from region 239A toward region 239B or from region 239A toward region 239C.

Circuit 270 enables the potential difference applied between electrode 250 and electrode 248 by amplifier 274 to be synchronized with the potential difference applied between plates 266 by amplifier 268. This enables electrons emitted from sources 245 to bombard target 208 for a respective duration which coincides with a region 239 selected by the magnitude and polarity of the potential difference applied between the deflection plates. Use of deflection plates with a row addressed field emitter array with support circuitry to sequence electron emission with the deflection waveforms is a scan means. Distance is maintained small facilitating a proximity focus to enable electrons emitted from the field emitter array which are accelerated to the target by the acceleration means to be concentrated on the regions of the target corresponding to the magnitude and polarity of the signal applied between the deflection plates which form the scan means. Beam landing areas are not shown in the figure.

Timing associated with the bombardment of the regions 239 has been previously provided in FIGS. 4A thru 4C. Proximity focusing means enables electrons emitted from array 244 to bombard the selected second stripe region 239 selected by the scan means.

The deflection plates illustrated in FIG. 5 can be applied to each row electrode of the field emitter array of FIG. 1. Such an addition would enable the electrons emitted from the sources in each row of the array to be displaced by an amount which would allow a greater percentage of the electron beam current density to bombard the surrounding ring rather than being directed through the hole of the pixel. This technique would reduce the time to shift the ring of the pixel being bombarded to equilibrium potential. Furthermore, if electron beams are deflected away from the holes of corresponding pixels during the write phase, then the read plate would need not provide a potential which would prevent electrons from reaching from the phosphor during the writing phase of operation.

Alternative deflection techniques exist. Utilizing the information provided herein, those knowledgeable in the state of the art will be able to identify techniques compatible with any desired displacement of the electron beam landing areas on the target. See for instance information in the articles titled "Microstructures for Control of Multiple Ion or Electron Beams" by Gary W. Jones et al, IEEE Transaction on Electron Device" vol. 36, No. 11, November 1989, and the article titled "Miniature Electron-Optical Columns" by T. H. P. Chang et al, IEEE Transactions on Electron Devices, Vol. 38, no. 10, October 1991 and the article titled "A Mixed-Field Type of Vidicon" by Kurt Schlesinger and Richard A. Wagner, IEEE Transactions on Electron Devices, Vol. ED-14, No. 3, March 1967.

Figure 6:
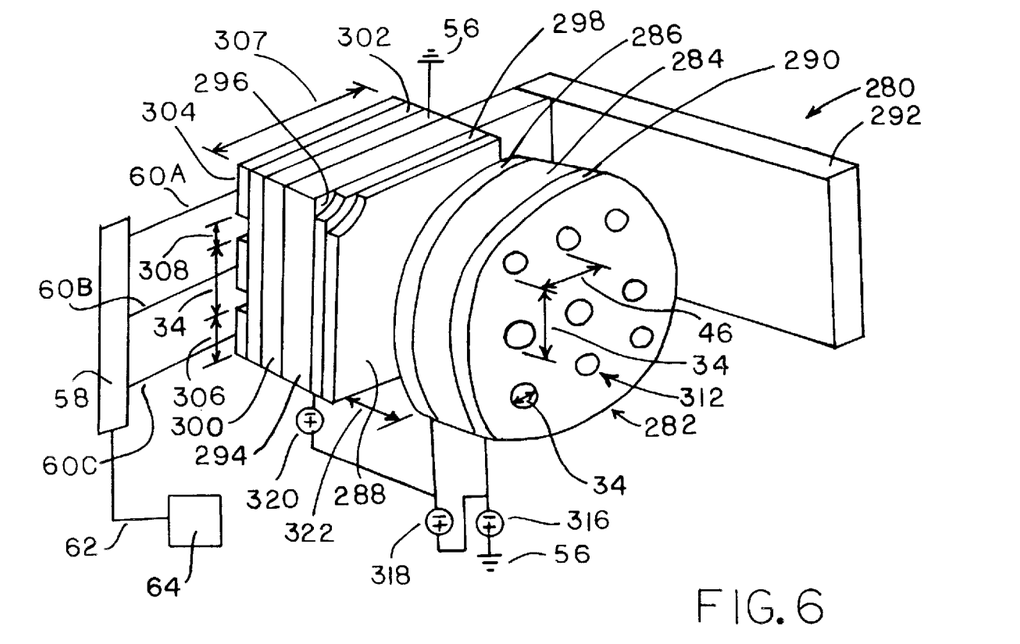
FIG. 6 shows an electron beam source array which comprises a photocathode means and a microchannel plate functioning as an electron multiplying means.

FIG. 6 shows a row addressed electron beam source array 280. Array 280 further includes a microchannel plate (MCP) 282. MCP 282 comprises a thin wafer of a porous semiconductor glass 284. At each of its major surfaces, a conductive costing, to serve respectively as a fitst electrode 286, to receive electrons from a photocathode 288, and a second electrode 290, to interact with the first electrode 286 to create an electric field in the porous semiconductor glass 284 from first electrode 286 to the second electrode 290 there being amplification in the number of electrons so that there is an amplified electrode image at second electrode 290 of the spatial distribution of photoelectrons emitted by photocathode 288. The electric field is not shown in the figure.

Array 280 further includes a plurality of vacuum housing side walls 292 and an input transmissive faceplate 294. Housing side walls 292 are shown in part to reveal features of my invention. Side walls 292 enable a vacuum environment to be established for use with my invention. Affixed to a first surface 296 of faceplate 294 is a transmissive photocathode electrode 298. Photocathode 288 is affixed to the surface of electrode 298 opposite faceplate 294. Means to affix a photocathode to an electrode and suitable means to affix an electrode to a transmissive faceplate are well understood by those knowledgeable in the state of the art. Information concerning materials suitable for use as transmissive electrodes and photocathodes are provided in the references cited herein.

Affixed to a second major surface of faceplate 294 is a transmissive common electrode 300. The second major surface of faceplate 294 is opposite surface 296. Electrode 300 is electrically connected to ground potential 56. The second major surface of faceplate 294 is not visible in the figure. Affixed to the surface of electrode 300 opposite faceplate 294 is an electroluminescence material layer 302.

Affixed to the surface of layer 302 opposite electrode 300 is a plurality of row electrodes 304. Adjacent row electrodes 304 are displaced by period 34. Each electrode 304 further includes an electrode width 306 parallel to period 34. Each electrode 304 further includes an electrode length 307 perpendicular to period 34. Adjacent electrodes 304 are separated by a row gap 308 parallel to period 34.

Each row electrode 304 is electrically connected to sequencer 58. Circuit 64 applies signal 62 to sequencer 58 enabling sequencer 58 to apply a respective potential 60 to each electrode 304 to control the potential difference applied between the row electrode 304 and electrode 300. Suitable sequences involving the potential differences applied between each electrode 304 and electrode 300 for generating row at a time addressing sequences have been previously identified.

Applying a potential difference between any one of the electrodes 304 and electrode 300 establishes an electric field across the portion of the layer 302 which lies between the row electrode 304 and electrode 300.

The portion of layer 302 lying underneath any electrode 304 will emit light as a function of the potential difference applied between the electrode 304 and electrode 300. Operation of an electroluminescence interface with row conductors is described in U.S. Pat. No. 3,046,540 to F. A. Litz et al, Jul. 24, 1962. Additional information concerning electroluminescence material can be found in the article titled DC Electroluminescence in Zinc Sulfide Films by W. A. Thornton, Journal of Applied Physics, Vol. 33, No. 10, October 1962 and section 3 page 87 of the book titled Electronic Image Storage.

Due to the relative proximity of layer 302 relative to photocathode 288, a spatial distribution of light, due in part to the geometry of the row electrode 304, will be incident upon photocathode 288. Photocathode 288 provides an electron image of the spatial distribution of light incident upon the photocathode 288.

MCP 282 is shown containing a plurality of pores 312. Pores 312 are arranged into a matrix of p rows and q columns. Adjacent pores 312 in each column q are displaced by period 34. Adjacent pores 312 in each row p are displaced by period 46. Each pore 312 further includes a pore diameter 314.

A first bias source 316 establishes an acceleration potential between electrode 290 and an electron collector mesh. The electron collector mesh is not shown in the figure. A second bias source 318 establishes a potential difference between electrode 290 and electrode 286 of MCP 282. A third bias source 320 establishes a potential difference between electrode 286 and electrode 298 to draw the photoelectrons generated by illuminating photocathode 288 across a vacuum gap 322. Gap 302 is relatively small so that photoelectrons emitted by photocathode 288 are proximity focused onto MCP 282. Typical gap dimensions are found in U.S. Pat. No. 4,481,531 to Warde et al, Nov. 6, 1984.

The amplified electron image created by MCP 282 provided a row addressed electron beam source array. Array 280 may be utilized to row address charge storage targets of my invention. In addition, as will be obvious to those knowledgeable in the state of the art utilizing the information provided herein, array 280 is capable of providing a flood mode of operation compatible with row at a time addressing.

The potential generated by source 316 relative to ground 56 is chosen to draw the amplified electron image from MCP 282 toward the storage target. The storage target is not shown in the figure. The potential can be selected from to provide high velocity and/or low velocity equilibrium writing techniques. Targets suitable for use with array 280 include the storage targets identified herein and in patent application Ser. No. 08/183,037.

Electrodes 304 are positioned relative to electrode 300 and pores 312 of MCP 282 so that each row electrode 304 overlaps a respective row p of pores 312. This insures that applying a potential difference between each electrode 304 and electrode 300 will generate a row of photoelectrons which will result in a corresponding amplified row of electrons at electrode 290. Use of row electrodes with an electroluminescence layer sandwiched between the row electrodes and a monolithic electrode is a suitable means to excite a row of photoelectrons from the photocathode. Alternatively, use of an electroluminescence layer disposed between at least one row electrode and a monolithic electrode is an optical row source means. As to be described herein, alternative means exist to generate optical row source means to generate a row of photoelectrons from the photocathode.

MCP 282 is positioned relative to the column conductors affixed to a storage target so that each column conductor overlaps a column of pores 312. Due in part to relative positioning, applying a potential difference between each row electrode 304 and electrode 300 generates a plurality of electron beams which are utilized to bombard a storage target on a row at a time basis. The storage target is not shown in the figure.

Although row electrodes were interfaced to an electroluminescence layer to assist in generating each row of electron beam sources, alternative techniques could be utilized to irradiate a photocathode and generate a row of electron beams. Such optical techniques could include a properly configured laser diode array. Laser arrays which could be utilized with my invention are described in the article "Surface-Emitting microlasers for Photonic Switching and Interchip Connections" by J. L. Jewell et al, Optical Engineering/March 1990/Vol. 29 No. 3.

Utilizing the information provided herein, modifications to laser arrays, to allow row at a time addressing, so as to be compatible with my invention, will become obvious to those knowledgeable in the state of the art. Additional means to optically address a photocathode to generate rows of photoelectrons are described in the reference cited herein.

Additional techniques for generating a plurality of optical row sources includes utilizing portions of the electro optical shutter configurations identified in the article titled "A Method of Matrix Addressing Polarization Rotating or Retarding Light Valve Arrays" by George W. Taylor, Proceedings of the IEEE, Vol. 58, No. 11, Nov. 1970. Utilizing the information provided herein, those knowledgeable in the state of the art will be able to identify the modification necessary to interface alternative technologies to develop row addressed electron beam source arrays.

Additional modifications to a MCP electron beam means could include a fiber optic faceplate to couple the spatial distribution of light to the photocathode. Such techniques are well understood by those knowledgeable in the state of the art. See for instance U.S. Pat. No. 4,741,692 to Hara et al, May 3, 1988. Utilizing the information provided herein, those knowledgeable in the state of the art will be able to identify amplifications levels of a MCP consistent with the light levels generated from activating a row electrode to generate the desired beam current in each respective electron beam bombarding the target.

Although utilizing a MCP provides the benefit of electron gain, rows of photoelectrons emitted from a photocathode may be focused directly onto a storage target. This eliminates the MCP. Focusing means to allow photoelectron emitted from a photocathode to be focused onto a corresponding target location are well understood by those knowledgeable in the art of the art.

Use of the MCP provides an electron multiplier means to increase the number of electrons bombarding a target on a row at a time basis. Although FIG. 11 shows the use of a MCP, alternative electron multiplier means exist and include metal dynode electron multipliers such as the device illustrated on page 215 of the book titled Flat Panel Displays and CRTs, Edited by Lawrence E. Tannas, Jr., Van Nostrand Reinhold company New York, 1985.

Utilizing the information provided herein, those knowledgeable in the state of the art will recognize that row addressed linear arrays can be implemented with photocathode means and/or electron multipler means and utilized to row address a storage target comprising a plurality of column conductors.

SUMMARY, RAMIFICATION, AND SCOPE

Thus the reader will see that the row addressed electron beam source array of my invention provides an increase in dwell time over serial scanned devices facilitating a more complete shift toward equilibrium potentials of floating target surfaces. In addition, my invention provides a convenient means to generate a flood electron beam source broadening the scope of potential applications compatible with row at a time electron beam addressing. Furthermore, my invention provides a means for compensation for non uniformities in electron emissions of electron beam sources.

While my above description contains many specifications, these should not be construed as limitations on the scope of the invention, but rather as a exemption of one preferred embodiment thereof. Many other variations are possible. Utilizing the information provided herein, those knowledgeable in the state of the art will be able to configure additional electron emission means into row addressed electron beam source arrays. Examples include utilizing an extended area thermal source overlapped by an aperture plate which is patterned with row electrodes which contain slots to enable the aperture plate to control electron flow on a row at a time basis. References include the article titled "Matrix Array Cathode Ray Tube" by J. D. Sirkis et al, IEEE Transaction on Electron Devices, September 1978 and U.S. Pat. No. 3,854,066, to Payne, Dec. 10, 1974.

Additional electron emission means can be configured to function as a row addressed electron beam source array includes a gas discharge. An aperture plate similar to the one described for use with extended area thermal emitters can be utilized to control the flow of electrons from a gas discharge. Examples of gas discharges being utilized as a source of electrons in electron beam addressed devices include the Lucitron, as described on pages 402 to 404 of the book titled "Flat Panel displays and CRTs".

Although the pixel configuration of the image transducers shown in the figures are longitudinal arrangement where the column conductors overlap electron beam landing areas, lateral flow targets are feasible with my invention. Lateral flow targets compatible with serial electron beam scanning are identified in the article titled "Some New Structure-Type Targets for The Vidicon—An Analysis of Their Operation" by S. A. Ochs, and P. K. Weimer, RCA Review, March 1958.

Utilizing the information provided herein, modifications to lateral flow targets to be compatible with electron beam row at a time addressing will be obvious to those knowledgeable in the state of the art. In addition, the beam landing areas would be located between adjacent column conductors, rather than having a column conductor overlap (face) a beam landing area. Accordingly, the geometric description enabling a pixel to be localized in a storage target can be broaden to encompass the juxtaposition between column conductors and beam landing area locations utilized in lateral flow target configurations. Definition for the localized relation of a pixel comprising a column conductor and a respective beam landing area can be identified as being adjacent to one another. This allows for relative locations involving a column conductor and a respective beam landing area forming a respective pixel which are side to side or facing (overlapping) one another.

Although the field emissions electron emitting means are described in FIG. 1 as cones, alternative geometric arrangements are permissible in my invention. Alternative field emission means include wedges. Row electrodes for use with field emission wedges include conductor strips with slots surrounding the tip of the wedge. Considerations in selecting a particular field emitter geometry include capacitance which effects row at a time line rates. Use of a wedge which extends the row electrode length would provide a continuous electron beam density in a respective second strip region on the target.

Use of deformable column conductors affixed to a variable impedance layer which is sensitive to pressure variations allows charge storage targets of my invention to be extended to acoustic imaging type transducers.

Light emitting diodes and laser diode arrays are compatible with the storage target of my invention. Utilizing the information provided herein, those knowledgeable in the state of the art will be able to configure such devices into a storage target comprising column electrodes.

As described in the timing diagrams of this application and application Ser. No. 08/183,037, consideration latitude exists in establishing the duration which the storage target is bombarded with electrons from the row addressed field emitter array of my invention. As identified, bombardment durations can span the active interval or blanking interval of a respective line period. Such durations greatly exceed those associated with serial scanned device. Accordingly, my invention provides considerable latitude in compensating for non uniformities in electron beam source emissions.

The preferred embodiment of my invention is the embodiment described in FIG. 1.

As identified in the patent application submitted by Craig D. Engle titled "Storage Target Device", mailed on Jun. 6, 1996, express mail label EH554821087US, the teachings of which are officially incorporated herein by reference, low velocity equilibrium writing modes of operation are feasible with my invention. Additional information concerning electron beam addressing techniques for depositing an electronic charge quantity on a charge storage target is provided in the reference cited herein. Accordingly, electron beam writing techniques requires consistency between the acceleration potential and the second electron emission ratio of the target surface being bombarded.

Although several techniques have been identified to provide an optical row source capability which facilitate flat panel packaging in my invention, alternative techniques which include lasers light sources with light modulators and appropriate beam expander optics and opto-mechanical scanners can be utilized with my invention. An electron multipler utilized in conjunction with a photocathode means reduces laser power requirements associated with providing an optical row source. Use of cylindrical lens are feasible with my invention.

If a row addressed linear array which comprises a photocathode is utilized with a scan means in my invention, then the row image formed by a cylindrical lens may be focused directly onto the photocathode. This effectively produces an optical row source capable of emitting a row of photoelectrons in sync with the optical modulator which is utilized to control the irradiance on the linear array comprising the photocathode.

Opto mechanical scan means can be utilized to displace an optical row source on a photocathode effectively providing a row at a time addressed photocathode. The opto mechanical scan means can be synchronized with the optical modulator to gate on and off the irradiance provided by the laser used to generate the row source which is incident on the photocathode. This approach generates a plurality of discrete rows of photoelectrons emitted from the photocathode in sync with the light modulator. Alternative techniques for generating optical row sources are well understood by those knowledgeable in the state of the art. See for instance information in U.S. Pat. No. 3,971,931 to Jehle, Jul. 27, 1976.

Accordingly, the scope of the invention should be determined not by the embodiments illustrated, but by the appended claims and the legal equivalents.

I claim:

1. An electron beam addressed storage target comprising:
    target means comprising:
        electron collector means,
        a substrate,
        a plurality of pixel elements arranged into a plurality of rows and columns,
        each said pixel element comprising:
            conductor means overlapping said substrate to form a beam landing area located on said target means,
    electron source means enabling said beam landing areas of said pixel elements in one or more of said rows to be simultaneously bombarded for a respective addressing interval with a plurality of electrons emitted from corresponding ones of a plurality of electron row sources,
    control means for applying a respective potential difference between said collector means and said conductor means of said pixel elements in the one or more of said rows during said respective addressing interval,
    whereby bombarding said beam landing areas of said pixel elements in said one or more of said rows with said plurality of electrons enables a second respective potential difference to be established between said beam landing areas and said conductor means of said pixel elements dependent on said respective potential difference applied between said collector means and said conductor means of said pixel elements during said respective addressing interval.

2. The device of claim 1 wherein said electron source means further comprises:
    a base electrode means,
    a plurality of non overlapping row electrons overlapping said base electrode means,
    each said row source comprises an electron emitting means operatively associated with one of said row electrodes and said base electrode means for emitting said plurality of electrons dependent upon a third potential difference applied between the row electrode and said base electrode means.

3. The device of claim 2 wherein each said emitting means emits said plurality of electrons by a field emissions phenomena.

4. The device of claim 1 wherein said plurality of electrons emitted from each said row source are emitted by a field emission phenomena.

5. The device of claim 1 wherein each said pixel element further comprises:
    a localized region adjacent to said beam landing area in which transmission thru said localized region of a second plurality of electrons incident thereon during a second interval is dependent upon said second respective potential difference.

6. The device of claim 5 wherein said second intervals in which said second plurality of electrons are incident on said localized region of said pixel elements coincide in time.

7. An electron beam addressed storage target comprising:
target means comprising:
electron collector means,
a substrate,
a plurality of pixel elements arranged into a plurality of rows and columns,
each said pixel element comprising:
conductor means overlapping said substrate to form a beam landing area located on said target means,
electron source means for simultaneously bombarding said beam landing areas of said pixel elements in one or more of said rows during a first interval with a plurality of electrons emitted from said source means and simultaneously bombarding said beam landing areas of said pixel elements in each said row during a second interval with a second plurality of electrons emitted from said source means,
control means to apply during said first interval a respective potential difference between said electron collector means and said conductor means of said pixel elements in the one or more of said rows thereby enabling a second respective potential difference to be established between said beam landing areas and said conductor means of the pixel elements dependent on said respective potential difference.

8. The device of claim 7 wherein each said pixel element further comprises:
a localized region adjacent to said beam landing area of said pixel element in which transmission thru said localized region of a portion of said second plurality of electrons incident thereon during said second interval is dependent upon said second respective potential difference.

9. The device of claim 8 wherein said plurality of electrons simultaneously bombarding said beam landing areas of said pixel elements in the one or more of said rows during said first interval and said second plurality of electrons simultaneously bombarding said beam landing areas of said pixel elements in each said row during said second interval are emitted from a respective electron emitting means,
said electron source means further comprises:
a base electrode means,
a plurality of non overlapping row electrons overlapping said base electrode means,
each said electron emitting means is operatively associated with at least one of said row electrodes and said base electrode means for emitting said plurality of electrons dependent upon a third potential difference applied between the corresponding one(s) of said row electrodes and said base electrode means.

10. The device of claim 9 wherein said plurality of electrons emitted from each said emitting means are emitted by a field emission phenomena.

11. The device of claim 7 wherein said electrons emitted during said first interval and said second plurality of electrons emitted during said second interval are emitted from said source means by a field emission phenomena.

12. An electron beam addressed storage target comprising:
target means comprising:
electron collector means,
a substrate,
a plurality of pixel elements arranged into a plurality of rows and columns,
each said pixel element comprising:
conductor means overlapping said substrate to form a beam landing area located on said target means,
electron source means comprising:
base electrode means,
a plurality of non overlapping row electrons means overlapping said base electrode means,
electron emitting means operatively associated with each said row electrode means and said base electrode means for emitting a plurality of electron dependent upon a potential difference applied between said row electrode means and said base electrode means,
said plurality of electrons emitted from each said emitting means simultaneously bombarding said beam landing areas of said pixel elements in a respective row of said pixel elements,
control means for synchronizing application of said potential difference between one or more of said row electrode means and said base electrode means during a first interval with application of a second respective potential difference applied between said collector means and said conductor means of each said pixel element in the respective rows of said pixel elements corresponding to the emitting means emitting said plurality of electrons thereby enabling said pixel elements in said respective row(s) to establish a third respective potential difference between said beam landing area and said conductor means of each of said pixel elements dependent upon said second respective potential difference applied between said collector means and said conductor means of said pixel element.

13. The device of claim 12 wherein said control means further comprises simultaneously applying a fourth potential difference between each said row electrode means and said base electrode means during a second interval thereby enabling a second plurality of electrons to simultaneously bombard said beam landing areas of said pixel elements in each of said rows of said pixel elements.

14. The device of claim 12 wherein said plurality of electrons emitted from each said emitting means are emitted by a field emission phenomena.

15. The device of claim 13 wherein each said pixel element further comprises:
a localized region adjacent to said beam landing area of said pixel element in which transmission thru said localized region of a portion of said second plurality of electrons incident thereon during said second interval is dependent upon said third respective potential difference.

16. The device of claim 15 wherein said plurality of electrons emitted by each said emitting means are emitted by a field emission phenomena.

17. The device of claim 16 wherein said beam landing area further comprises an electrically conductive ring surrounding said localized region of said pixel element.

18. An electron beam addressed storage target comprising:
target means comprising:
electron collector means,
a substrate,
a plurality of pixel elements arranged into a plurality of rows and columns, each said pixel element comprising:
conductor means overlapping said substrate to form a beam landing area located on said target means,
said conductor means of said pixel elements in each said column are electrically connected, electrode source means comprising:
base electrode means,
a plurality of non overlapping row electrons means overlapping said base electrode means,
electron emitting means operatively associated with each said row electrode means and said base electrode means for emitting a plurality of electron dependent upon a potential difference applied between said row electrode means and said base electrode means,
said plurality of electrons emitted from each said emitting means simultaneously bombarding said beam landing areas of said pixel elements in a respective row of said pixel elements, control means for synchronizing application of said potential difference between any of said row electrode means and said base electrode means during a first interval with application of a second respective potential difference applied between said collector means and the electrically connected conductor
means of said pixel elements in each said column, thereby enabling each respective one of said pixel elements in any of said rows in which said beam landing areas of said pixel elements are simultaneously bombarded with said plurality of electrons to acquire an electronic charge dependent on said second respective potential difference applied between said collector means and said electrically connected conductor means of said respective one of said pixel elements.

19. An electron beam addressed storage target comprising:
target means comprising:
electron collector means,
a substrate,
a plurality of pixel elements arranged into a plurality of rows and columns,
each said pixel element comprising:
conductor means overlapping said substrate to form a beam landing area located on said target means,
said conductor means of said pixel elements in each said column are electrically connected, electrode source means enabling said beam landing areas of said pixel elements in any of said rows to be simultaneously bombarded for a respective addressing interval with a plurality of electrons emitted from corresponding ones of a plurality of electron row sources, control means for applying a respective potential difference between said conductor means and said electrically connected conductor means of said pixel elements in each said column during said respective addressing interval, thereby enabling each respective one of said pixel elements in any of said rows in which said beam landing areas of said pixel elements are simultaneously bombarded with said plurality of electrons to acquire an electronic charge dependent on said respective potential difference applied between said collector means and said electrically connected conductor means of said respective one of said pixel elements.

* * * * *